(12) United States Patent
Nagashima

(10) Patent No.: US 6,419,751 B1
(45) Date of Patent: Jul. 16, 2002

(54) SUBSTRATE PROCESSING METHOD AND SUBSTRATE PROCESSING APPARATUS

(75) Inventor: Shinji Nagashima, Kikuyo-Machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/625,305

(22) Filed: Jul. 25, 2000

(30) Foreign Application Priority Data

Jul. 26, 1999 (JP) ............................................. 11-211301

(51) Int. Cl.[7] .............................................. C23C 16/00
(52) U.S. Cl. ........................ 118/715; 118/725; 118/733
(58) Field of Search ................................ 118/715, 725, 118/733

(56) References Cited

U.S. PATENT DOCUMENTS 5,707,687 A * 1/1998 Ueda et al. ................. 427/240

FOREIGN PATENT DOCUMENTS

| JP | 4-346035 | 12/1992 |
|---|---|---|
| JP | 11-251311 | 9/1999 |
| JP | 11-260809 | 9/1999 |

* cited by examiner

Primary Examiner—Alexander G. Ghyka
(74) Attorney, Agent, or Firm—Rader, Fishman & Grauer, PLLC

(57) ABSTRACT

In a hot plate for performing heat processing while an inert gas is supplied, a mounting table is provided with a groove and a lower end portion of a lid body can be inserted into the groove. The lid body is lowered in two steps by a lid body drive apparatus. The lid body forms a processing chamber between the lid body and the mounting table by the lowering of the first step, and the lower end portion of the lid body is inserted into the groove by the lowering of the second step, thereby reducing the processing chamber in capacity. Consequently, in a substrate processing apparatus which requires a supply of gas, it becomes possible to reduce the capacity of the processing chamber and to reduce the required amount of gas.

12 Claims, 13 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus each for performing heat processing for a substrate such as a semiconductor wafer or the like in, for example, a low-oxygen atmosphere.

2. Description of the Related Art

In processes of semiconductor device fabrication, a layer insulating film is formed, for example, by an SOD (Spin on Dielectric) system. In this SOD system, a layer insulating film is formed by forming a coating film on a semiconductor wafer and performing chemical processing, heat processing, or the like by a sol-gel process or the like.

When a layer insulating film is formed by the sol-gel process in such an SOD system, the semiconductor wafer is transferred form a carrier station to a processing section and, for example, a coating solution in which colloids of TEOS (tetraethoxysilane) are dispersed in an organic solvent is applied onto the semiconductor wafer in a coating apparatus unit provided in the processing section. Thereafter the semiconductor wafer is transferred to an aging unit and subjected to gelling processing, and then transferred to a solvent exchange unit, where exchange of solvents is performed. Thereafter, a hot plate unit is performed heat processing for the semiconductor wafer as necessary. The semiconductor wafer on which a layer insulating film is completed as described above is returned to the carrier station.

In the hot plate unit of this SOD system, after the semiconductor wafer is transferred into a processing chamber and supported by raising and lowering pins, a lid body is lowered by a drive mechanism, whereby a lower end portion of the lid body and a top face of a hot plate closely contact each other to form the processing chamber having a certain capacity. Thereafter, prior to the heat processing, nitrogen gas that is an inert gas is supplied in order to prevent oxidation of the semiconductor wafer, whereby the inside of the processing chamber is exchanged for an atmosphere with a low oxygen concentration. Further, nitrogen gas is constantly introduced into the processing chamber, and additionally air is exhausted through an exhaust pipe provided at the lid body also during processing so that the heat processing is performed in an atmosphere with a certain low oxygen concentration.

However, in the aforesaid conventional art, a large amount of inert gas to be supplied is constantly required, which is not economically preferable. Further, since it often happens that processing is performed simultaneously in a plurality of processing chambers, if the amount of inert gas necessary for one processing apparatus increases, an extremely large amount of gas is required for the whole system including the above processing apparatuses, resulting in a case in which it is impossible to supply gas at once. Therefore, a design of the lid body shallow in depth is conceivable in order to decrease the capacity of the processing chamber. However, since the semiconductor wafer needs to be away from the hot plate in order not to be heated nor oxidized before the inside of the processing apparatus is exchanged for the inert gas, there is a limit to making the lid body shallow in depth.

SUMMARY OF THE INVENTION

An object of the present invention is to exchange an atmosphere in a processing chamber for an inert gas without increasing temperature of a semiconductor wafer and to reduce a supply amount of the inert gas while keeping a low oxygen concentration.

To achieve the above objects, a first aspect of the present invention is a substrate processing method for performing processing for a substrate on a mounting table using a substrate processing apparatus including the mounting table for mounting the substrate thereon, a lid body for forming a processing chamber with the mounting table, gas supply means for supplying gas into the processing chamber, and exhaust means for exhausting an atmosphere in the processing chamber, the substrate processing method comprising the steps of: forming the processing chamber between the mounting table on which the substrate is mounted and the lid body; and reducing a capacity of the formed processing chamber.

A second aspect of the present invention is a substrate processing apparatus comprising: a mounting table for mounting a substrate thereon; a lid body with a lower face side opened for forming a processing chamber with the mounting table; gas supply means for supplying gas into the processing chamber; exhaust means for exhausting an atmosphere in the processing chamber; a drive mechanism for relatively vertically moving the lid body and the mounting table; and means for controlling a capacity of the processing chamber formed between the mounting table on which the substrate is mounted and the lid body by relatively vertically moving the lid body and the mounting table by the drive mechanism.

In the present invention, for example, the lid body in the substrate processing apparatus is lowered with respect to the mounting table to thereby reduce the capacity of the processing chamber, so that the supply amount of gas supplied into the processing chamber can be reduced.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, preferred embodiments of the present invention will be explained with reference to the accompanying drawings.

Figure 1:
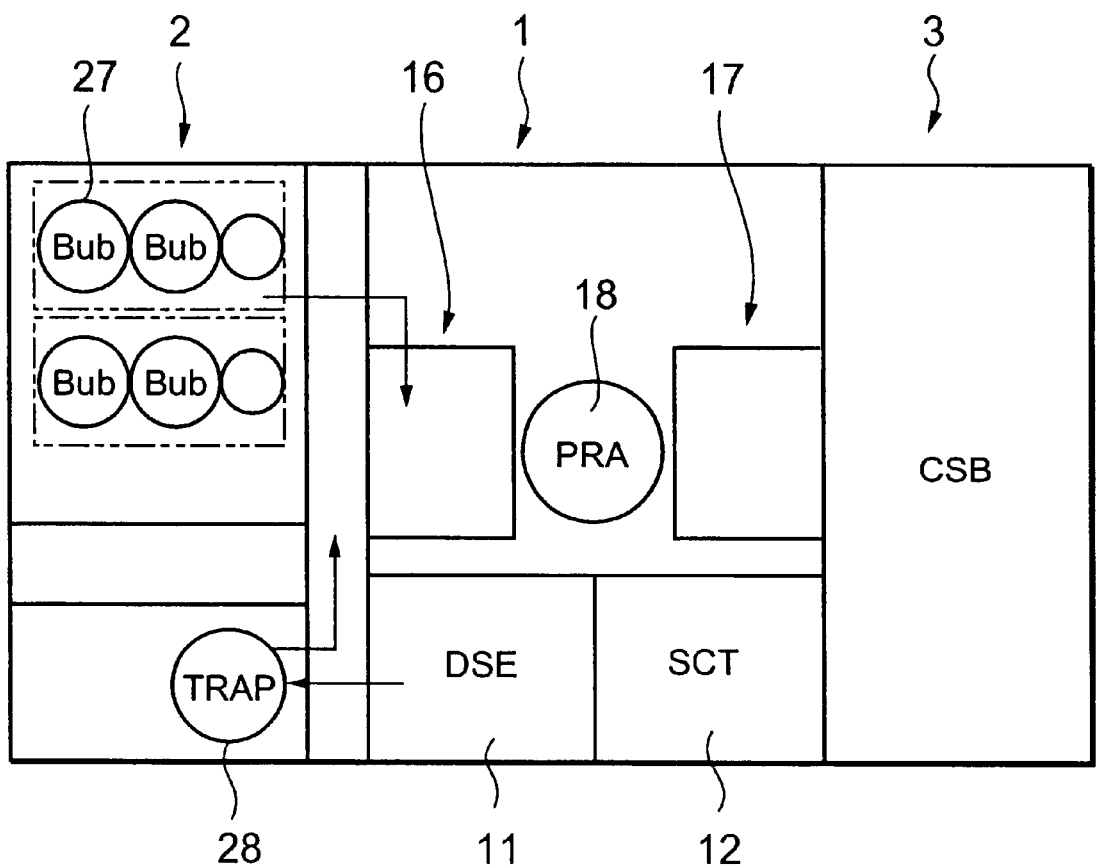
FIG. 1 is a plan view of an upper tier of an SOD system according to an embodiment of the present invention.
Figure 2:
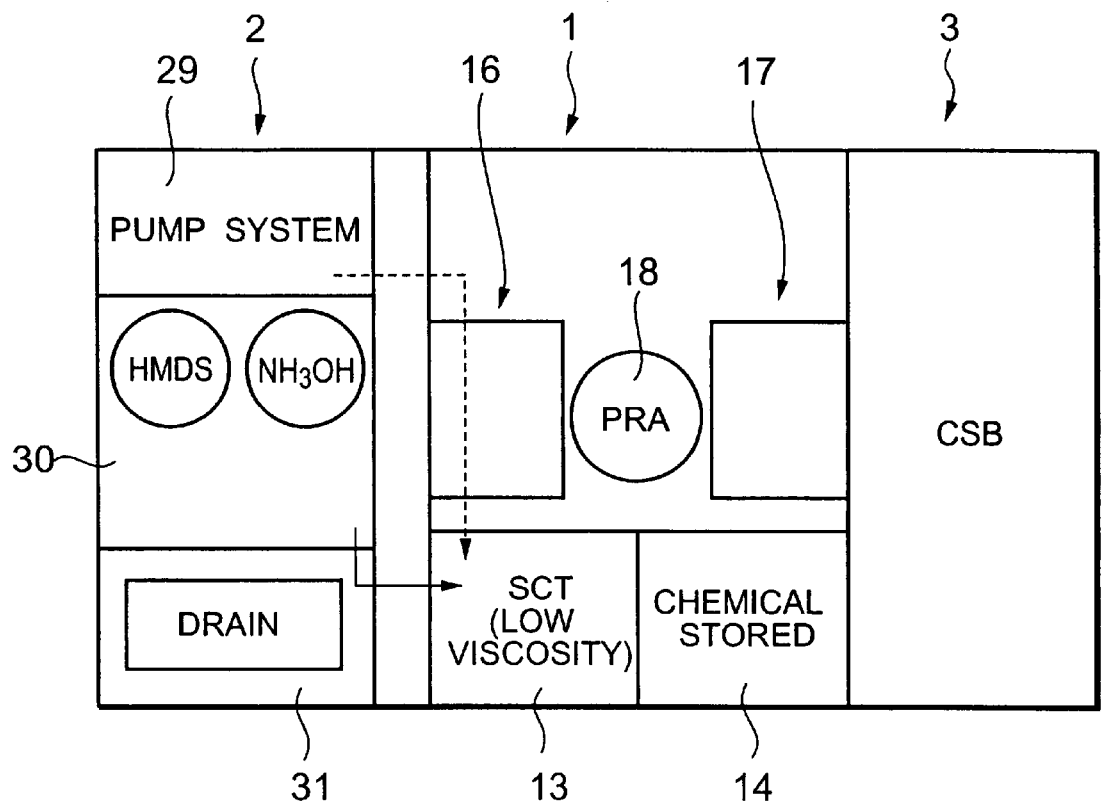
FIG. 2 is a plan view of a lower tier of the SOD system according to the embodiment of the present invention.
Figure 3:
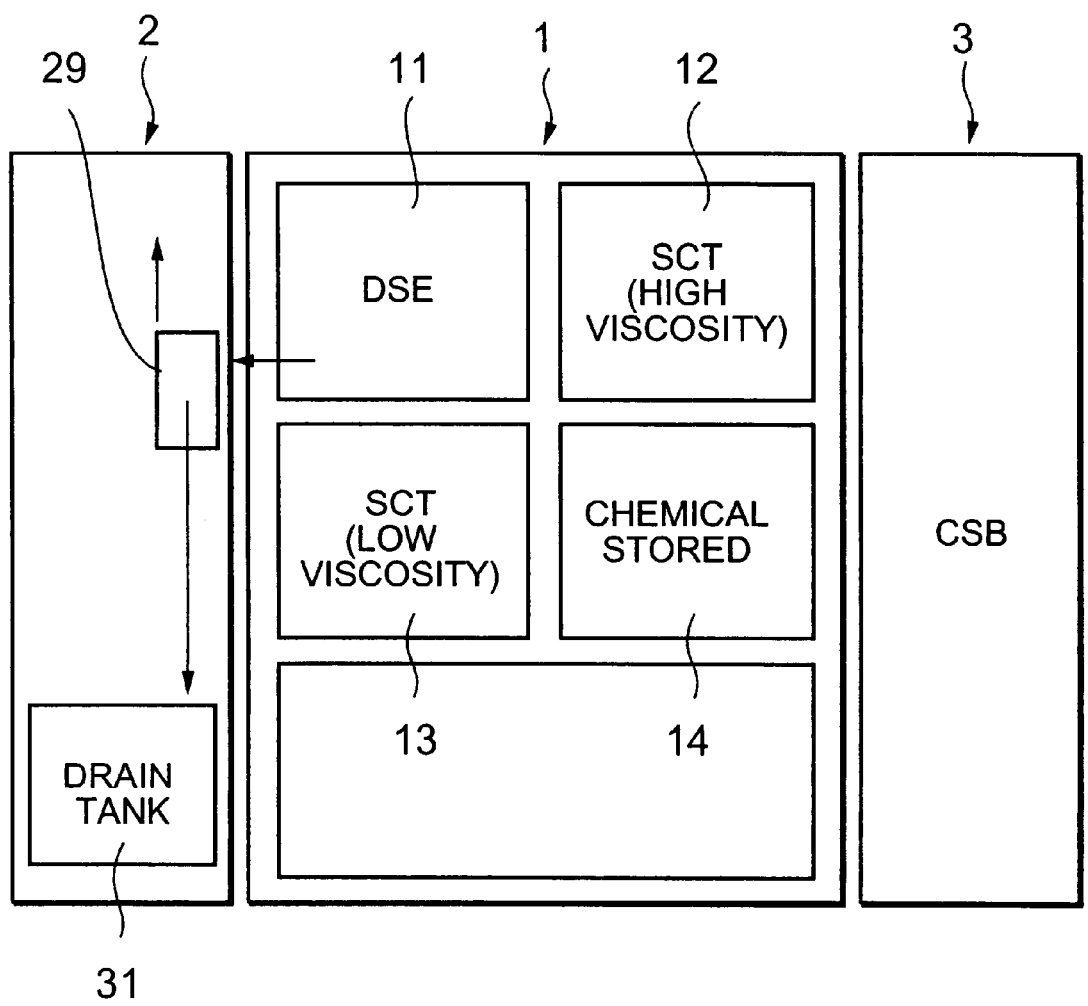
FIG. 3 is a side view of the SOD system shown in FIG. 1.
Figure 4:
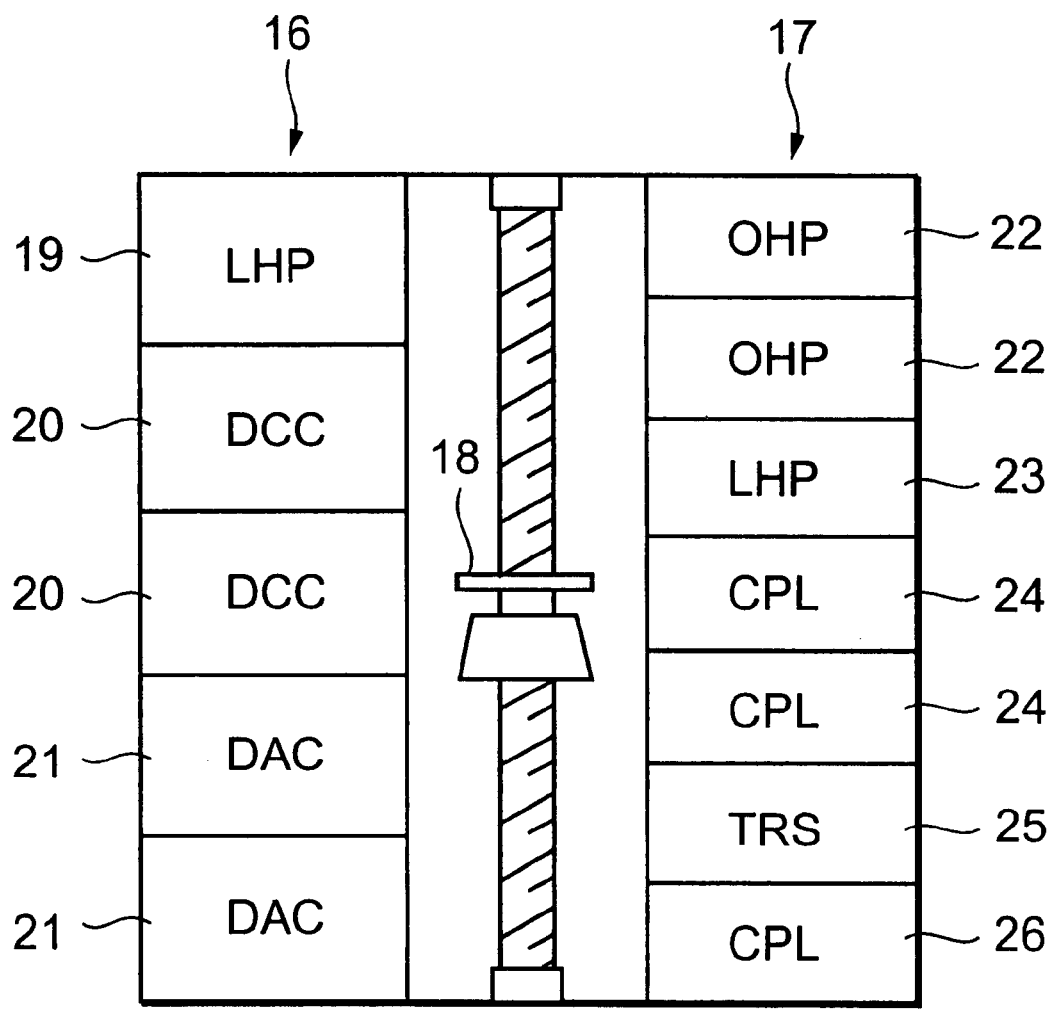
FIG. 4 is a side view showing two processing unit groups which are installed in the SOD system shown in FIG. 1 and in each of which a plurality of processing units are multi-tiered.

FIG. 1 is a plan view of an upper tier of an SOD system according to an embodiment of the present invention, FIG. 2 is a plan view of a lower tier of the SOD system, FIG. 3 is a side view of the SOD system shown in FIG. 1, and FIG. 4 is a side view of two processing unit groups 16 and 17 installed in the SOD system shown in FIG. 1.

The SOD system schematically has a processing section 1, a side cabinet 2 that is a chemical section, and a carrier station (CSB) 3.

The processing section 1 has a solvent exchange unit (DSE) 11 provided at an upper tier on the front side thereof and a coating unit (SCT) 12 for high viscosity as shown in FIG. 1 and FIG. 3, and further has a coating unit (SCT) 13 for low viscosity which is applied to the sol-gel process and a chemical chamber 14 containing a chemical and the like as shown in FIG. 2 and FIG. 3.

The processing unit groups 16 and 17 in each of which a plurality of processing units are multi-tiered are provided at the central portion of the processing section 1 as shown in FIG. 1 and FIG. 2. A transfer body 18 which ascends and descends to transfer a wafer W is disposed between the processing unit groups 16 and 17. As shown in FIG. 4, the processing unit group 16 is structured by a low-temperature hot plate (LHP) 19, two DCC (Dielectric Cure and Cooling-off) processing units 20, and two aging units (DAC) 21 being tiered from the top in order. Moreover, the processing unit group 17 on the right side is structured by two high-temperature hot plates (OHP) 22 according to this embodiment, a low-temperature hot plate (LHP) 23, two cooling plates (CPL) 24, a delivery section (TRS) 25, and a cooling plate (CPL) 26 being tiered from the top in order. Incidentally, it is also possible that the delivery section (TRS) 25 has a function of a cooling plate.

Hereinafter, the structure of the hot plate (OHP) 22 as a substrate processing apparatus according to this embodiment will be explained in detail.

Figure 5:
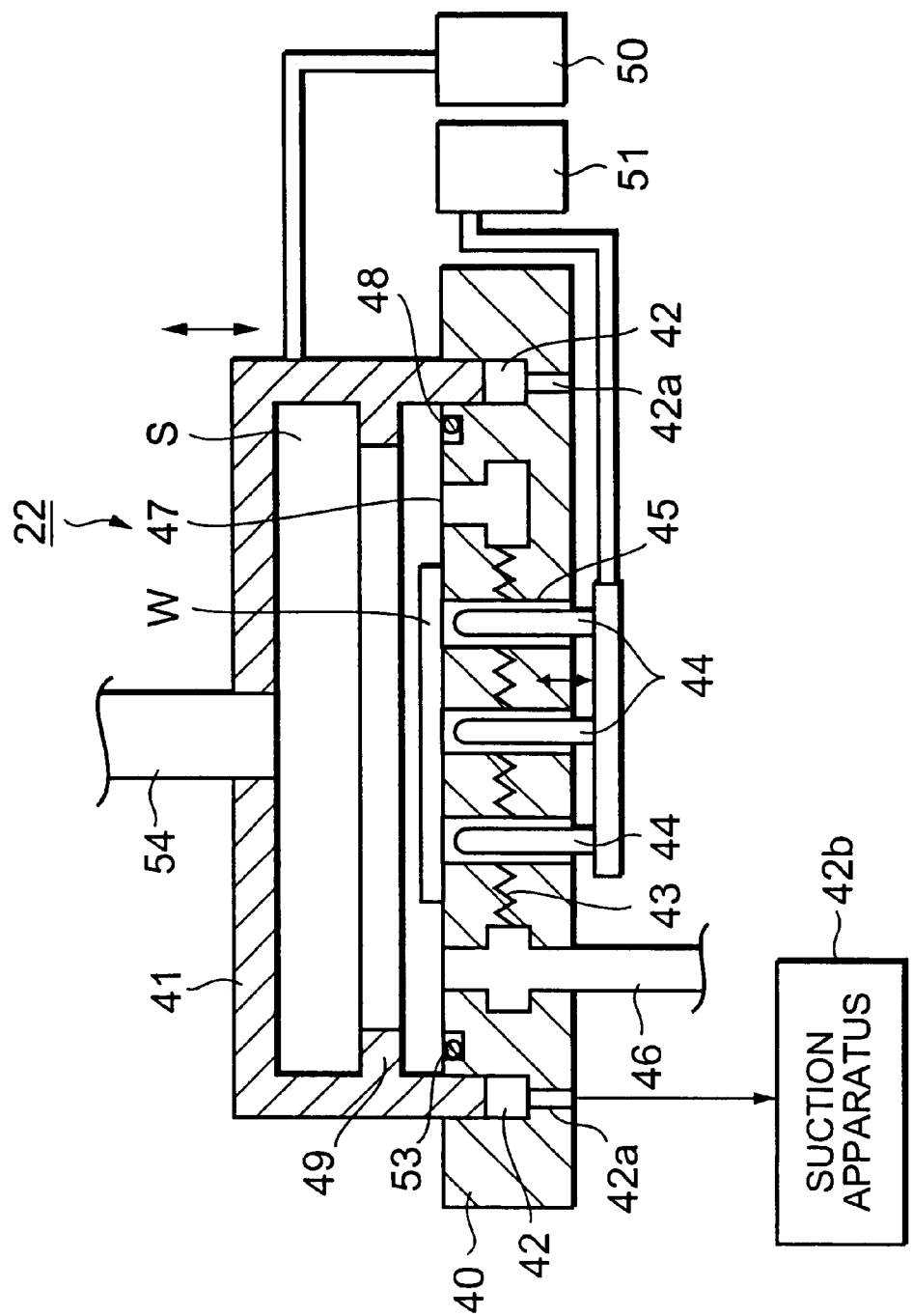
FIG. 5 is an explanatory view of a vertical section of a hot plate for high temperatures that is a substrate processing apparatus according to a first embodiment.
Figure 6:
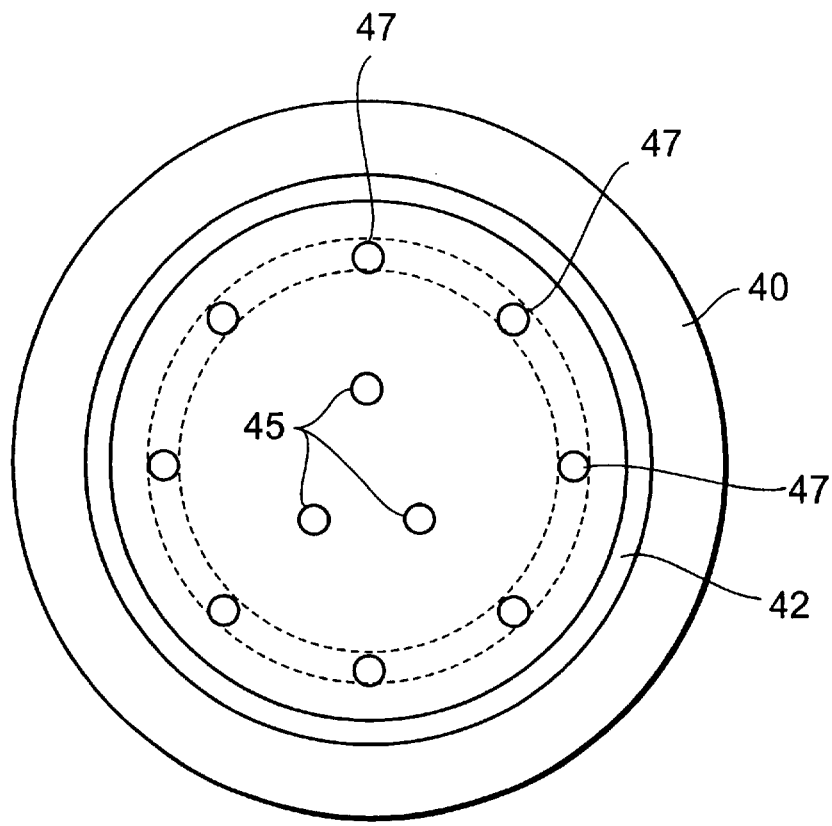
FIG. 6 is a plane view of a mounting table provided in the hot plate in FIG. 5.
Figure 7:
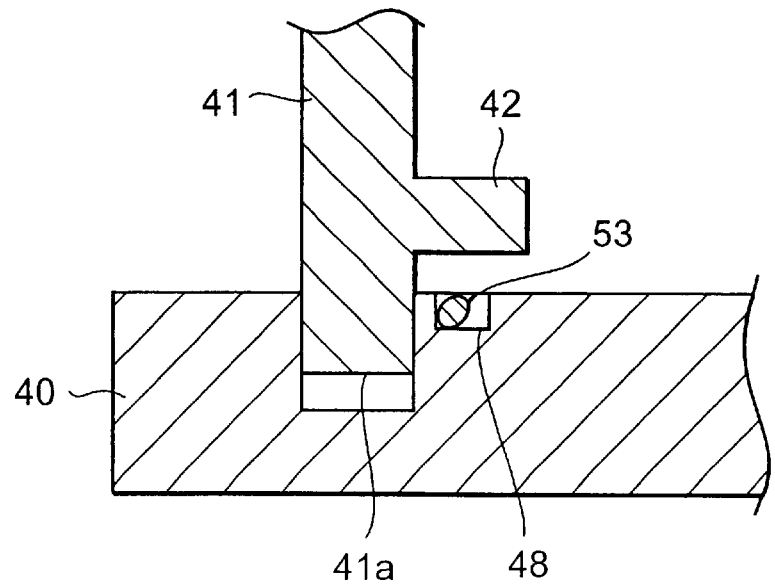
FIG. 7 is an enlarged view of a sealing member and the surroundings provided in the hot plate in FIG. 5.

The hot plate (OHP) 22 includes a mounting table 40 in a thick disc shape and a lid body 41, in an almost cylindrical shape with the under face side being opened, for forming a processing chamber S with the mounting table 40 as shown in FIG. 5 and FIG. 6. The outer shape of the mounting table 40 is larger than that of the lid body 41 in size, and an annular groove 42 into which a lid body lower end portion 41a of the lid body 41 can be inserted is formed at the peripheral portion of the mounting table 40. Moreover, many suction holes 42a are provided at the bottom face of the groove 42. A suction apparatus 42b sucks air at the bottom portion of the lid body 41 through the suction holes 42a. Thereby, airtightness of the inside of the processing chamber can be improved when the lid body lower end portion 41a descends to the bottom face of the groove 42.

In the mounting table 40, a heater 43 for heating the wafer W is embedded and generates heat by power supply from a power source (not shown) so as to heat the wafer W on the mounting table 40 to a predetermined temperature. Moreover, three though holes 45 are formed in the mounting table 40, and raising and lowering pins 44 are movable in a vertical direction in the through holes 45. The raising and lowering pins 44 are raised and lowered by a raising and lowering pin drive apparatus 51 and can stop at an optional position.

At the surrounding portion of the through holes 45 and outside a position at which the wafer W is mounted, a plurality of blast ports 47 are arranged on a concentric circle, thereby making it possible to supply nitrogen gas or another inert gas supplied from a supply passage 46 into the processing chamber.

The lid body 41 is vertically movable by means of a lid body drive apparatus 50 and can stop at an optional position. An annular stopper 49 is provided on the inner periphery of a side wall of the lid body 41. At a position on the inner periphery side of the aforesaid annular groove 42 and corresponding to the stopper 49, a groove 48 for a sealing member is formed and an O-ring 53 is provided as a sealing member.

With the above configuration, when the lid body 41 is lowered by the lid body drive apparatus 50, even after the lid body lower end portion 41a is inserted into the groove 42, the lid body 41 can be lowered until the stopper 49 abuts the front face of the mounting table 40. Further when the stopper 49 abuts the front face of the mounting table 40 as above, the stopper 49 and the O-ring 53 closely contact each other, resulting in an airtight state of the processing chamber S.

At the center of the top portion of the lid body 41, an exhaust port 54 communicating with exhaust means (not shown) is formed so as to exhaust an atmosphere in the processing chamber S. In this embodiment, it is possible to uniformly exhaust an inert gas supplied from the blast ports 47, which are annularly arranged at the surrounding portion of the wafer W, from the peripheral portion to the central portion along a radial direction thereof.

Next, operations of the hot plate (OHP) 22 of which the principal portion is thus structured will be explained with processes for forming a layer insulating film, which is performed in the SOD system.

First, the wafer W which is taken out of the carrier station (CSB) 3 is transferred to the delivery section (TRS) 25 and transferred therefrom to a cooling plate 24 or 26, in which temperature management is performed, by the transfer body 18. Then, the wafer W is transferred to the low viscosity coating unit (SCT) 13 and coated with a coating solution. Thereafter, the wafer W coated with the coating solution is immediately transferred to the aging unit (DAC) 21 and subjected to gelling processing. Then, the wafer W is immediately transferred to the solvent exchange unit (DSE) 11 for exchanging solvents and processed.

Thereafter, the wafer W is transferred to the low-temperature hot plate (LHP) 19 and the solvent thereof is allowed to evaporate. The wafer W is then transferred to the high-temperature hot plate (OHP) 22 so as to allow a solvent with a higher boiling point to evaporate.

Here, operations of the high-temperature hot plate (OHP) 22 that is a substrate processing apparatus according to an embodiment of the present invention will be explained in detail.

Figure 8:
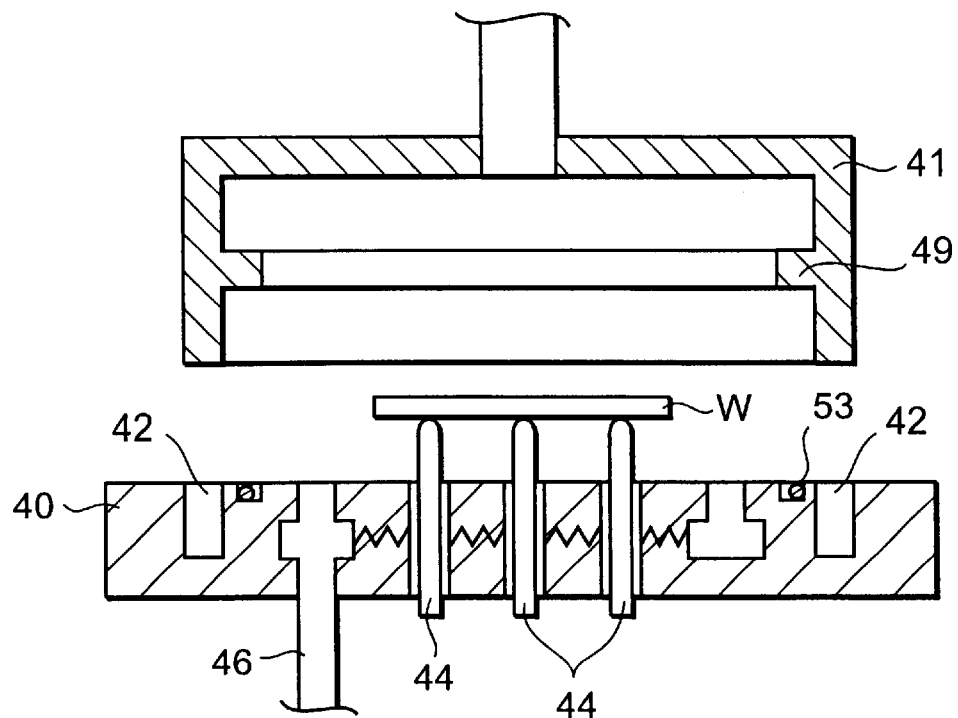
FIG. 8 is a view of a state when a substrate is supported by raising and lowering pins of the hot plate in FIG. 5.
Figure 9:
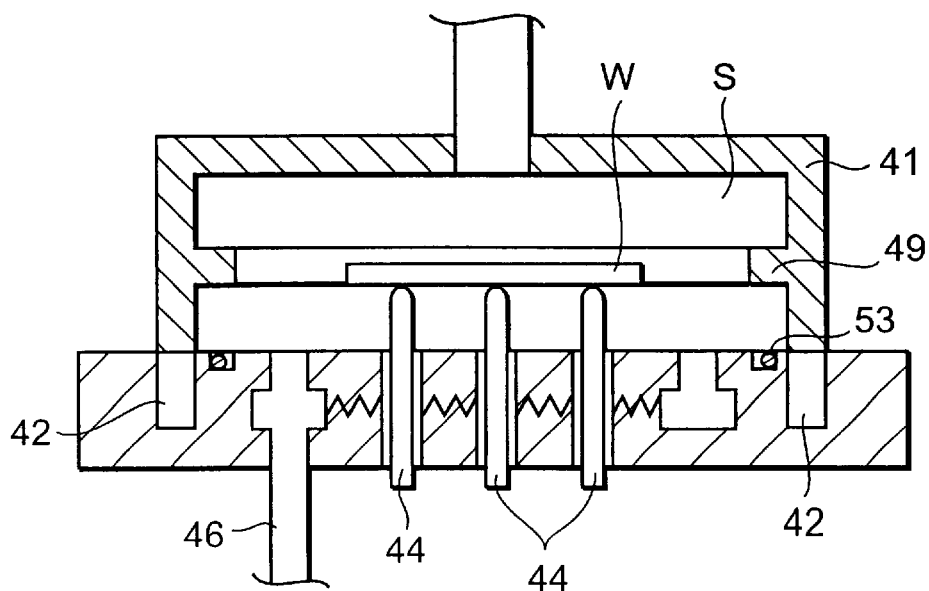
FIG. 9 is a view of a state when a processing chamber is formed with a lid body and the mounting table of the hot plate in FIG. 5.

First, the wafer W for which the aforesaid processes have been completed is transferred to the hot plate (OHP) 22 by the transfer body 18. At this time, the lid body 41 is moved upward, and the raising and lowering pins 44 are also raised and wait at a predetermined position. Then, the transfer body 18 moves to a position between the lid body 41 and the mounting table 40 and above the mounting table 40 and stops, and the wafer W is delivered to the raising and lowering pins 44 which wait there in advance as shown in FIG. 8. At this time, nitrogen gas is supplied into the processing chamber S through the supply passage 46 from the blast port 47 regarding that the wafer W is supported on the raising and lowering pins 44 as a trigger. Thereafter, the lid body 41 is lowered by the lid body drive apparatus 50 and temporarily stops where the lower end portion of the lid body 41 reaches the front face of the mounting table 40 to thereby form the processing chamber S between the lid body 41 and the mounting table 40 as shown in FIG. 9. Here, the atmosphere in the processing chamber S is exchanged for nitrogen gas which is continuously supplied until an oxygen concentration in the processing chamber S is brought to not more than a predetermined value. After the exchange, the gas is supplied with the supply amount reduced. It should be noted that the supplied nitrogen gas is being exhausted from the exhaust port 54 that is provided at the lid body 41.

Figure 10:
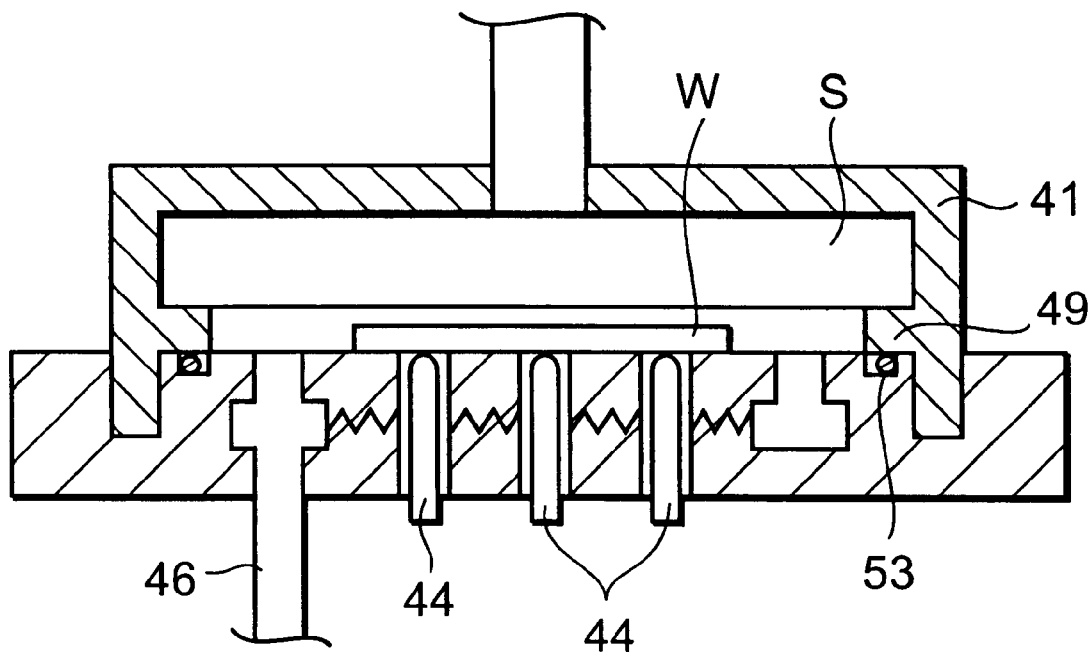
FIG. 10 is a view of a state when the lid body of the hot plate in FIG. 5 is closed and the substrate is supported on the mounting table.

Next, the lid body 41 which has been temporarily suspended for a predetermined period of time is again lowered by the lid body drive apparatus 50 and stops where the stopper 49 of the lid body 41 contacts the mounting table 40 as shown in FIG. 10. At this time, as described above, the raising and lowering pins 44 lower in synchronization with the lid body 41 and the wafer W supported by the raising and lowering pins 44 are also lowered to be mounted on the mounting table 40. Thereafter, the wafer W is subjected to heat processing by the mounting table 40 which has been heated to a predetermined temperature in advance.

Next, after the completion of the heating, the lid body 41 and the raising and lowering pins 44 are again raised and the raising and lowering pins 44 stop at a position where the wafer W can be delivered to the transfer body 18. Thereafter, the raising and lowering pins 44 deliver the wafer W to the transfer body 18 and then stand by as they are to wait for the delivery of a wafer W which is subsequently processed.

As described above, in the hot plate (OHP) 22 that is the substrate processing apparatus according to the present invention, the lid body lower end portion 41a is inserted into the mounting table 40 during the time of processing, so that a capacity of the processing chamber S can be decreased. As a result, an amount of nitrogen gas, which is supplied to restrain the oxygen concentration in the processing chamber to not more than a predetermined value, can be smaller than ever. For instance, the supply amount of nitrogen gas is about 30 l/min. where the capacity of the processing chamber S is large, but if the capacity of the processing chamber S is reduced as described above, the supply amount of nitrogen gas can be reduced to about 5 l/min. Further, the processing chamber capacity is small during the heat processing, whereby imbalance in distribution of the oxygen concentration in the processing chamber S becomes small, so that the wafer W can be uniformly processed.

After the completion of the aforesaid heat processing, the wafer W is returned to the carrier station (CSB) 3, where a predetermined series of layer insulating film is formed.

Further, the lid body 41 is lowered to reduce the capacity of the processing chamber S in the above embodiment, but in place of that, it is suitable to attach a drive apparatus for raising and lowering the mounting table 40 to the mounting table 40 so as to reduce the capacity of the processing chamber S by raising the mounting table 40. In this case, after the lid body 41 forms the processing chamber S with the mounting table 40 and the atmosphere in the processing chamber S is exchanged for nitrogen gas, only the raising and lowering pins 44 are lowered since the lid body 41 is unnecessary to be lowered again, whereby the wafer W is mounted on the mounting table 40. Thereafter, the mounting table 40 is raised by the drive apparatus attached thereto, thereby achieving reduction in processing chamber capacity.

Next, a hot plate (OHP) 60 of a type that the outer shape of a lid body is formed larger than that of a mounting table in size, and the lid body is lowered so as to surround the mounting table will be explained as a second embodiment.

Figure 11:
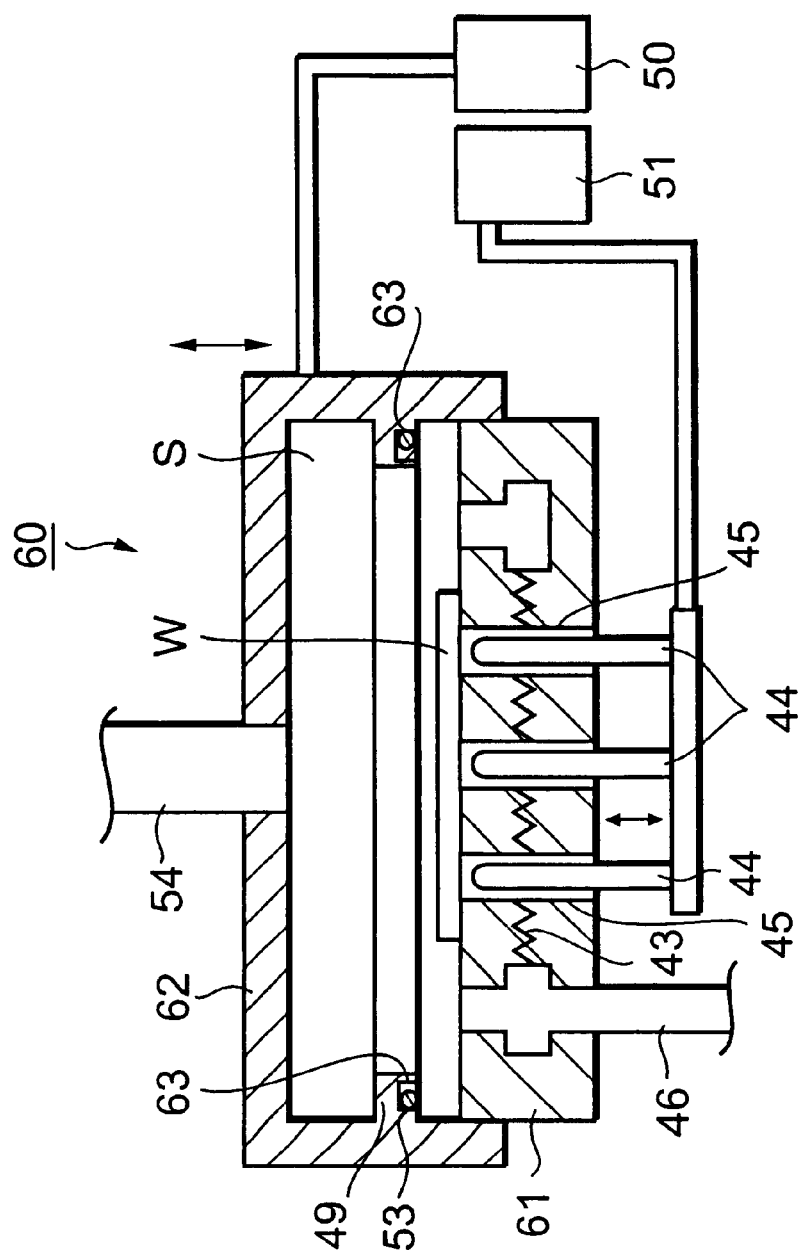
FIG. 11 is an explanatory view of a vertical section of a hot plate that is a substrate processing apparatus according to a second embodiment.

As shown in FIG. 11, in the hot plate (OHP) 60, the inner periphery of a lid body 62 is formed larger than the outer periphery of a mounting table 61. On the lid body 62, a stopper 49 is annularly provided in the same manner as the lid body 41 in the first embodiment, and a groove 63 for a sealing member is cut in an under face of the stopper 49. The other structure of an exhaust port 54 of the lid body 62, a lid body drive apparatus 50, a gas supply passage 46 of the mounting table 61, raising and lowering pins 44, and the like is the same as that of the hot plate (OHP) 22 in the first embodiment.

Similarly to the above-described first embodiment, when the wafer W is supported on the raising and lowering pins 44 and nitrogen gas is started to be supplied, the lid body 62 is lowered by the lid body drive apparatus 50 and stopped where the lower end portion of the lid body 62 reaches the front face of the mounting table to thereby form a processing chamber S between the lid body 62 and the mounting table 61. The supply of nitrogen gas is continued in the above state, and when the atmosphere in the processing chamber S is lowered to a predetermined oxygen concentration, the supply amount of the gas is reduced. Thereafter, the lid body 62 is started to lower again and the wafer W is also lowered in synchronization therewith. When the wafer W is mounted on the mounting table 61 and the stopper 49 of the lid body 62 stops at the mounting table 61, the lowering stops. At this time, the mounting table 61 and an O-ring 53 closely contact each other, resulting in an airtight state of the processing chamber S.

Thereafter, the wafer W is subjected to heat processing by being heated by a heater 43 embedded in the mounting table 61. After the completion of the heat processing, the lid body 62 and the wafer W are raised as in the above-described first embodiment and the wafer W is delivered to a transfer body 18.

According to the second embodiment, the processing chamber capacity can be reduced by the lowering of the lid body 62, so that the supply amount of nitrogen gas is reduced and processing is performed at low cost. Moreover, the reduction in processing capacity allows flows of nitrogen gas to be stable and the distribution of oxygen concentration in the processing chamber S to become even, thereby uniformly processing the wafer W.

The lid body 62 is lowered to reduce the capacity of the processing chamber S in the aforesaid hot plate 60, but it is also suitable that the mounting table 61 is raised to decrease the capacity of the processing chamber S. In this case, since the mounting table 61 is raised, it is not necessary to provide a function of the drive mechanism for lowering the lid body 62 in synchronization with the raising and lowering pins 44.

Next, still another embodiment of the present invention will be explained.

Figure 12:
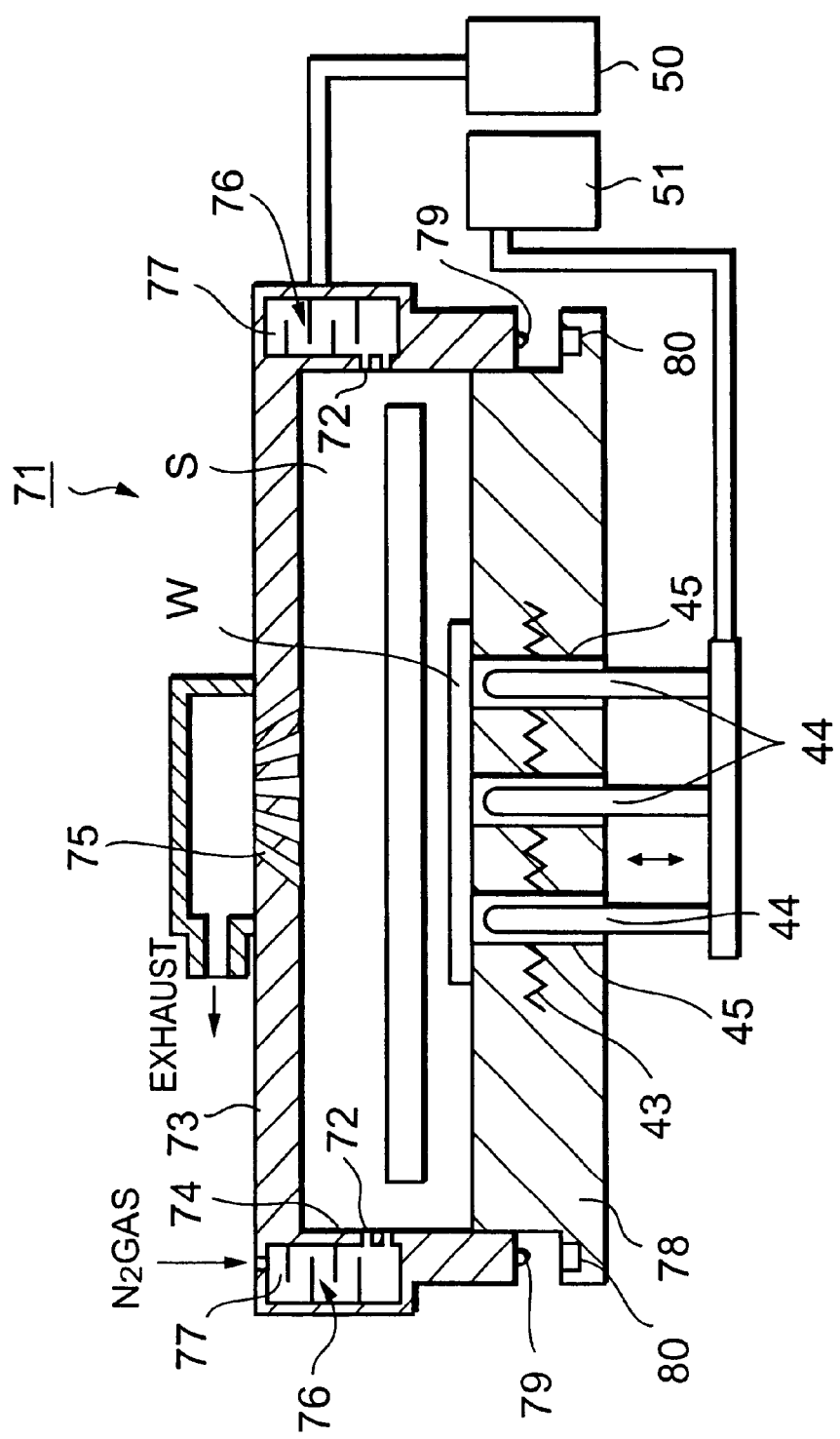
FIG. 12 shows a vertical section of a hot plate according to another embodiment of the present invention.

FIG. 12 is a sectional view showing the structure of a hot plate according to this embodiment.

As shown in FIG. 12, in this hot plate 71, a plurality of, for example, 36 or 72 blast ports 72 for supplying nitrogen gas into a processing chamber S are provided along an inner periphery portion 74 of a lid body 73. Moreover, at the center of the top portion of the lid body 73, an exhaust port 75 in a shower shape, which communicates with exhaust means (not shown), is provided. The provision of the blast ports 72 and the exhaust port 75 structured as above allows flows of air in the processing chamber S to become uniform and the temperature distribution in the processing chamber S to become even.

Furthermore, a buffer 76 for temporarily storing nitrogen gas to be blasted from the blast ports 72 and spreading out the nitrogen gas to the periphery of the processing chamber S is provided inside the lid body 73 to surround the periphery of the processing chamber S. In the buffer 76, a passage of the nitrogen gas meanders with guide members 77. Thereby, it becomes possible to uniformly supply the nitrogen gas from the periphery of the processing chamber S into the processing chamber S, and further to uniformly preheat the nitrogen gas by the use of the heat of the processing chamber S.

An O-ring 79 for keeping the airtightness of the processing chamber S is provided at a contact portion of an outer periphery bottom portion of the lid body 73 with a mounting table 78. Meanwhile, a cooling mechanism 80 is provided at a position of the mounting table 78 contacting the O-ring 79. The cooling mechanism 80 can be configured, for example, by laying a cooling pipe in which a cooling water circulates.

Figure 13:
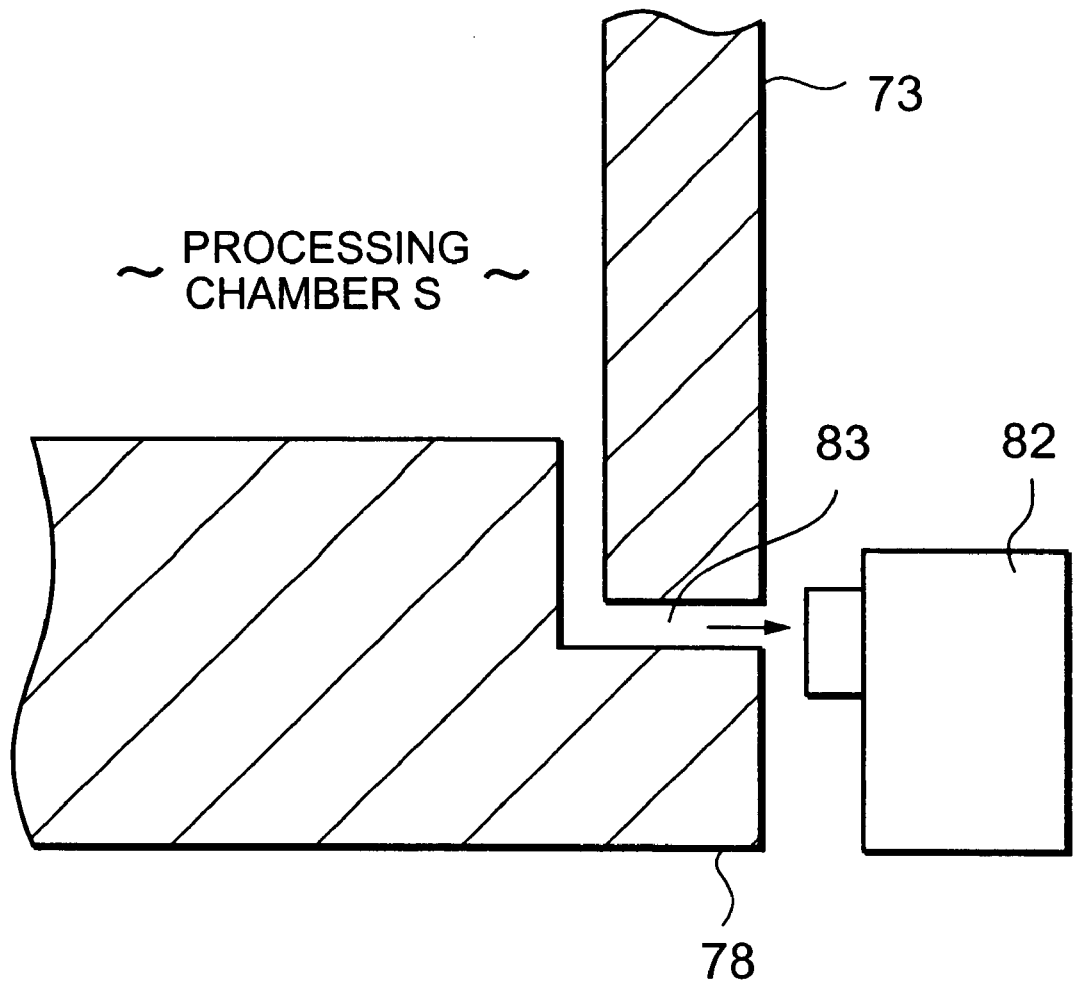
FIG. 13 shows a vertical section of a hot plate according to still another embodiment of the present invention.

Incidentally, in stead of tightly shutting of the lid body 73 and the mounting table 78 at the contact portion as described above, a clearance 83 may be intentionally provided between the mounting table 78 and the lid body 73 as shown in FIG. 13. Then, the supply and the exhaust of the nitrogen gas are controlled to bring the processing chamber S to a positive pressure, thereby preventing air from entering the inside of the processing chamber S. In that case, the provision of an exhaust mechanism 82 for exhausting gas in the processing chamber S through the clearance 83 can more efficiently prevent air from entering the inside of the processing chamber S.

Figure 14:
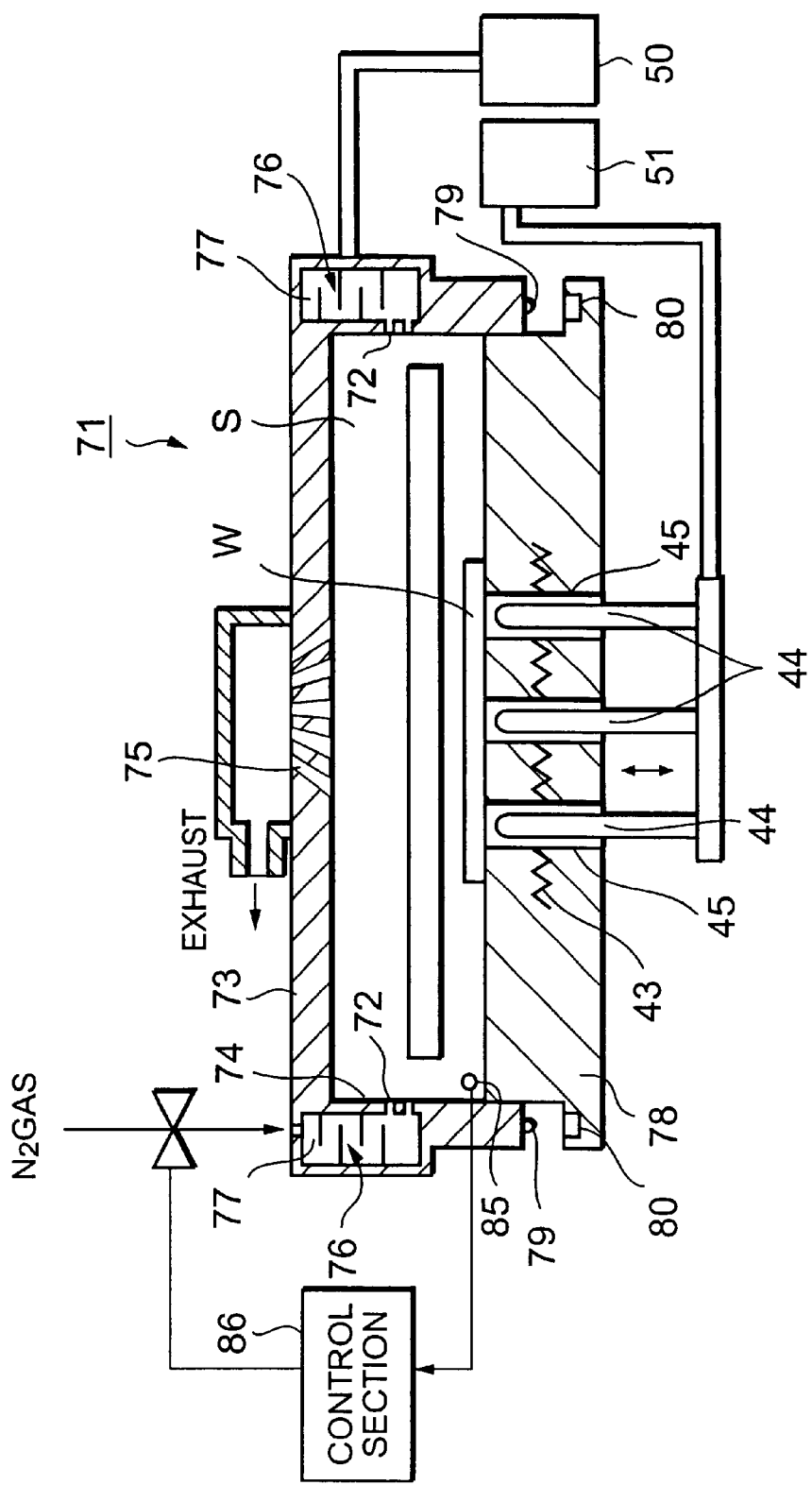
FIG. 14 shows a vertical section of a hot plate according to yet another embodiment of the present invention.

The supply amount of nitrogen gas is controlled in accordance with the capacity of the processing chamber S in the aforesaid embodiment. However, it is also suitable that a monitoring apparatus 85 for monitoring the oxygen concentration in the processing chamber S is provided so that a control section 86 controls the amount of gas supplied into the processing chamber S in accordance with the monitored oxygen concentration as shown in FIG. 14. Thereby, it becomes possible to control more finely the supply amount of nitrogen gas.

Figure 15:
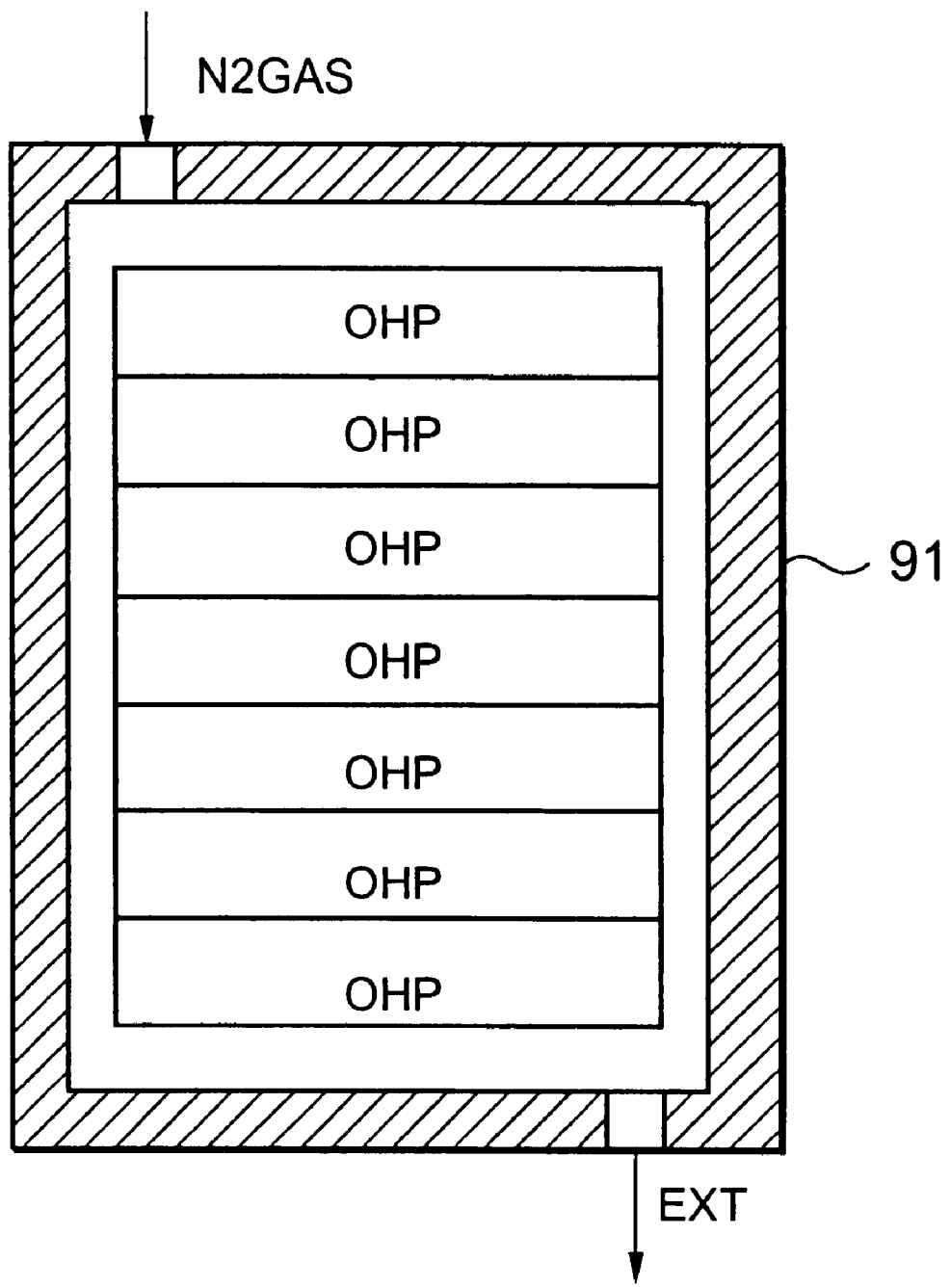
FIG. 15 is an explanatory view according to further yet another embodiment of the present invention.

Further, as shown in FIG. 15, hot plates (OHP) are multi-tiered in a box 91 having an enclosed structure and the inside of the box 91 is brought to a low-oxygen state, for example, a nitrogen gas atmosphere, thereby making it possible to prevent more efficiently oxidation of a substrate in the processing chamber S.

The substrate processing apparatus described above is a hot plate (OHP) for high temperatures in the SOD system. In addition to that, the present invention is applicable to a substrate processing apparatus which needs a gas supply in the SOD system and a substrate processing apparatus which needs a gas supply in the developing and coating system for performing lithography processing. Moreover, as for the substrate, the present invention is applicable to not only a disc-shape substrate such as a wafer, but also to a square substrate such as an LCD substrate.

As has been described, according to the present invention, a substrate can be processed with the capacity of a processing chamber decreased. Therefore, the supply amount of gas can be reduced, resulting in reduced gas cost. Further, since one processing apparatus needs a small amount of gas, it becomes possible to supply gas simultaneously to a greater number of processing apparatuses in the system. Moreover, flows of gas become stable and there occurs no unevenness in atmosphere in the processing chamber, whereby the substrate can be uniformly processed and yields can be improved. Furthermore, according to the present invention, it is possible that after the atmosphere in the processing chamber is sufficiently exchanged for an inert gas, the substrate is mounted on a mounting table by raising and lowering members. Accordingly, the processing for the substrate is started only after the processing chamber is brought to the inert atmosphere, whereby the substrate does not react unnecessarily, resulting in improved yields. Further, according to the present invention, a sealing member is provided between a lid body and the mounting table, which prevents the gas from leaking from a contact portion between the lid body and the mounting table, so that the flows of gas can be kept without disturbance. Consequently, the substrate is uniformly processed in a stable atmosphere, resulting in improved yields. Furthermore, a stopper member is provided on the lid body, thereby preventing collision between a lower end portion of the lid body and a bottom portion in a groove of the mounting table, or between the lid body and the substrate. Moreover, since a sealing member is provided on the stopper member, when the stopper member contact the mounting table, the sealing member and the mounting table also contact each other so that the processing chamber is brought to airtight, whereby the flows of gas in the processing chamber are kept without disturbance. Consequently, the substrate is uniformly processed in a stable atmosphere, resulting in improved yields.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus, comprising:

a mounting table for mounting a substrate thereon;

a heater for heating the substrate mounted on the mounting table;

a raising and lowering member being able to freely appear and disappear from a top face of the mounting table and support the substrate;

a lid body with a lower face side opened for forming a processing chamber with a mounting table;

gas supply means for supplying gas into the processing chamber;

exhaust means for exhausting an atmosphere in the processing chamber;

monitoring means for monitoring an oxygen concentration in the atmosphere in the processing chamber;

a drive mechanism for relatively vertically moving the lid body and the mounting table; and a controller for controlling movement of the raising and lowering member so that the substrate is not put on the heated mounting table until the oxygen concentration is less than a predetermined amount when the atmosphere in the processing chamber has been exhausted from the processing chamber, and for controlling a capacity of the processing chamber formed between the mounting table on which the substrate is mounted and the lid body by relatively vertically moving the lid body and the mounting table by the drive mechanism.

2. The apparatus as set forth in claim 1, wherein said mounting table has a form larger in size than that of a lower end portion of said lid body viewing from the plane, and wherein said mounting table is provided with a groove into which the lower end portion of said lid body is inserted.

3. The apparatus as set forth in claims 1, wherein an inner periphery of said lid body has a form larger in size than an outer periphery of said mounting table.

4. The apparatus as set forth in claim 1, further comprising:

a sealing member for sealing between said lid body and said mounting table.

5. The apparatus as set forth in claim 4, further comprising:

a stopper member for restricting an access of said lid body and said mounting table, wherein said sealing member is provided on the stopper member.

6. The apparatus as set forth in claim 4, further comprising:

a cooling mechanism for cooling said sealing member.

7. The apparatus as set forth in claim 1, wherein a clearance is formed between said mounting table on which the substrate is mounted and said lid body.

8. The apparatus as set forth in claim 7, further comprising:

an exhaust mechanism for exhausting an air inside said processing chamber through the clearance.

9. A substrate processing apparatus, comprising:

a mounting table for mounting a substrate thereon;

a lid body with a lower face side opened for forming a processing chamber with a mounting table;

gas supply means for supplying gas into the processing chamber;

exhaust means for exhausting an atmosphere in the processing chamber;

a drive mechanism for relatively vertically moving the lid body and the mounting table;

means for controlling a capacity of the processing chamber formed between the mounting table on which the substrate is mounted and the lid body by relatively vertically moving the lid body and the mounting table by the drive mechanism; and means for controlling an amount of gas supplied into said processing chamber by said gas supply means in accordance with the capacity of said processing chamber.

10. A substrate processing apparatus, comprising:

a mounting table for mounting a substrate thereon;

a lid body with a lower face side opened for forming a processing chamber with a mounting table;

gas supply means for supplying gas into the processing chamber;

exhaust means for exhausting an atmosphere in the processing chamber;

a drive mechanism for relatively vertically moving the lid body and the mounting table;

means for controlling a capacity of the processing chamber formed between the mounting table on which the substrate is mounted and the lid body by relatively vertically moving the lid body and the mounting table by the drive mechanism;

monitoring means for monitoring an oxygen concentration in said processing chamber; and means for controlling an amount of gas supplied into said processing chamber by said gas supply means in accordance with the monitored oxygen concentration.

11. A substrate processing apparatus, comprising:

a mounting table for mounting a substrate thereon;

a lid body with a lower face side opened for forming a processing chamber with a mounting table;

gas supply means for supplying gas into the processing chamber;

exhaust means for exhausting an atmosphere in the processing chamber;

a drive mechanism for relatively vertically moving the lid body and the mounting table;

means for controlling a capacity of the processing chamber formed between the mounting table on which the substrate is mounted and the lid body by relatively vertically moving the lid body and the mounting table by the drive mechanism; and means for controlling an amount of gas supplied into said processing chamber by said gas supply means and an amount of atmosphere exhausted from said processing chamber by said exhaust means to bring the inside of said processing chamber to a positive pressure.

12. A substrate processing apparatus, comprising:

a mounting table for mounting a substrate thereon;

a lid body with a lower face side opened for forming a processing chamber with a mounting table;

gas supply means for supplying gas into the processing chamber;

exhaust means for exhausting an atmosphere in the processing chamber;

a drive mechanism for relatively vertically moving the lid body and the mounting table; and means for controlling a capacity of the processing chamber formed between the mounting table on which the substrate is mounted and the lid body by relatively vertically moving the lid body and the mounting table by the drive mechanism;

wherein said gas supply means includes a buffer disposed at a periphery of said processing chamber for temporarily storing the gas to be supplied and for spreading the gas to the periphery of said processing chamber.

* * * * *